United States Patent [19]

Coleman

[11] 3,748,480

[45] July 24, 1973

[54] MONOLITHIC COUPLING DEVICE INCLUDING LIGHT EMITTER AND LIGHT SENSOR

[75] Inventor: Michael G. Coleman, Tempe, Ariz.

[73] Assignee: Motorola, Inc., Franklin Park, Ill.

[22] Filed: Nov. 2, 1970

[21] Appl. No.: 85,900

[52] U.S. Cl. ..... 250/211 J, 250/217 SS, 317/235 N
[51] Int. Cl. ..... H01l 15/00
[58] Field of Search ..... 250/211 J, 217 J; 317/235 N

[56] References Cited

UNITED STATES PATENTS

| | | | |
|---|---|---|---|
| 3,558,897 | 1/1971 | May | 250/217 SS X |
| 3,636,358 | 1/1972 | Groschwitz | 250/217 SS X |
| 3,358,146 | 12/1967 | Ing, Jr. et al. | 250/211 J X |
| 3,445,686 | 5/1969 | Rutz | 250/211 J X |
| 3,436,548 | 4/1969 | Biard et al. | 317/235 N X |
| 3,443,102 | 5/1969 | Kaye | 250/211 J |
| 3,270,235 | 8/1966 | Loebner et al. | 250/211 J X |

*Primary Examiner*—Walter Stolwein
*Attorney*—Mueller & Aichele

[57] ABSTRACT

A solid state monolithic optical coupling device including a light emitting PN junction, a light sensor and an insulating body. The light emitting PN junction is formed by a body of P-type semiconductor and a body of N-type semiconductor. The insulating body is formed on the body of N-type semiconductor and the light sensor includes a body of photoconductive material formed on the insulating body. Electrical contacts are provided on the P-type and on the N-type semiconductor, respectively for biasing the light emitting PN junction, and spaced contacts are provided on the body of photoconductive material for applying a voltage thereto. When the light emitting junction is forward biased, light emitted thereat is transmitted through the insulating body and is absorbed by the photoconductive material, causing the conductivity thereof to change and thereby changing the current through the spaced electrodes thereon.

6 Claims, 7 Drawing Figures

PATENTED JUL 24 1973

3,748,480

Figure 1:
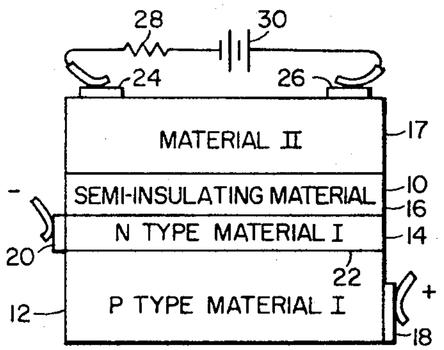

INVENTOR.

Michael G. Coleman

BY Mueller & Aichele

ATTY'S.

MONOLITHIC COUPLING DEVICE INCLUDING LIGHT EMITTER AND LIGHT SENSOR

BACKGROUND

Coupling devices are known comprising light emitters which produce light upon energization thereof by an input electrical signal and further comprising light sensors of the variable resistance type or of the photocell type, the sensor being positioned so as to be exposed to the light produced by the emitter. Since the sensor and emitter are discrete elements in accordance with the prior art, they must be held in their proper relative position by further equipment and they are usually housed for protection of the emitter and the sensor. The such known coupling devices are quite elaborate and therefore quite expensive to produce.

It is an object of this invention to provide an improved coupling device which comprises a light emitter and a light sensor, said coupling device being monolithic in form.

It is another object of this invention to provide an improved coupling device including a light emitter on a light sensor which is simpler than known such coupling devices.

SUMMARY

A light emitter is provided which comprises a body of semiconductive material such as GaAs, GaP, $GaAs_xP_{1-x}$, $Ga_{1-x}In_xP$ or of any other materials which are useful in making light emitting diodes. A further body of semiconductor which changes its electrical conductivity significantly upon being exposed to light such as Si, Ge, PbS or many others is integrally fixed to the light emitter body other than by cementing thereto. That is, the light sensor may be grown on or deposited on a surface of the light emitter body, whereby, in effect, the completed coupler is monolithic in the sense that it is a one piece coupler and in the sense that it is not made of two pieces which are cemented together. The sensor may take the shape of a layer of semiconductive material whose resistance changes with the light to which it is exposed, as mentioned above, or it may take the shape of one or more PN junctions such as is provided by a diode or a transistor or a plurality thereof. The light sensor may be grown or deposited directly on the light emitter, preferably on the N portion of the light emitter, or a layer of intermediate material, which may be resistive or semi-insulative GaAs or Si or $GaAs_{1-x}P_x$ or many other such materials is provided between the light emitter and the light sensor, to at least partially electrically isolate the emitter from the sensor. While as stated above, the light sensor may be grown or deposited on the light emitter, either sensor or emitter may be grown on the other, depending on relative melting temperatures, vapor pressure or other growth conditions. Other types of electrical isolation such as junction isolation may be provided between the emitter and the sensor.

DESCRIPTION

The invention will be better understood upon reading the following description in connection with the accompanying drawing in which:

FIGS. 1 through 7 illustrate various embodiments of this invention.

Turning first to FIG. 1, a body 10 of semiconductor materials comprises a bottom layer 12 of P material which may be referred to for convenience as P material I, a lower layer 14 of N material, referred to as N material I, an upper layer 16 of semi-insulating material, and a top layer 17 of material, referred to as material II, which may be different from the material of layers 12 and 14. The material I is one of a group of compound semiconductors which efficiently produce light when a PN junction formed in the material is properly biased and may include the P and the N forms respectively of GaAs, GaP, $GaAs_{1-x}P_x$ or $Ga_{1-x}In_xP$ well as many other compound semiconductors that are useful in producing light. While the layers 12 and 14 are usually the same material, doped in a known manner to be P or N type respectively, the layers 12 and 14 may be different materials. For example, the layer 12 may be P type $Ga_{1-x}Al_xAs$ and the layer 14 may be N type GaAs, producing a PN heterojunction. The layers 12 and 14 have respective input electrodes 18 and 20 applied thereto. Upon applying a voltage to the electrodes 18 and 20 in a direction to apply a forward bias across the PN junction 22 between the layers 12 and 14, light will be produced in or near the PN junction 22.

The electrically isolating layer 16 is of a material which has a resistivity greater than about $5 \times 10^4$ ohm-cm, the preferred value of resistivity being about $10^8$ ohm-cm, and may be very pure or very closely compensated semiconductor material such as Si, or a semiconductor suitably doped to produce this resistivity such as GaAs doped with Fe or Cr. Other materials having the stated resistance may be used for the layer 16. The material of the layer 16 must be at least partially transparent to the light emitted from the PN junction 22 to allow sufficient light to reach the light sensing layer 17.

Figure 2:
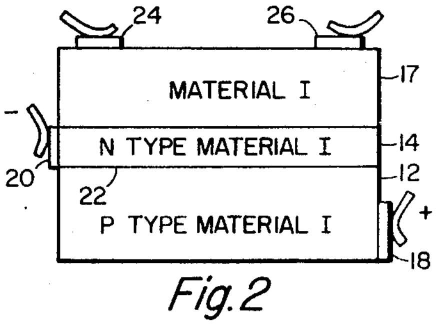

The light sensing layer 17 is of a material, for convenience referred to as Material II, that absorbs at least a portion of the light generated at or near the PN junctions 22, producing hole-electron pairs in the material of layer 17. Material II may be of Ge, Si, PbS or InAs or any other material whose electrical conductivity changes significantly with exposure to light. Since the light produced by the PN junction will travel more readily through the N type layer 14 than through the P type layer 12, the light sensor comprising the layer 17 is directly applied, as shown in FIG. 2 or indirectly applied, as shown in FIG. 1 to the N type layer 14. Since the FIGS. 1 and 2 differ only by omission of the semi-insulating layer 16, the same reference characters are applied to similar elements in the two Figures and no further explanation of FIG. 2 is given. In both FIGS. 1 and 2, the resisitivity of the layer 17 changes as the light to which it is exposed, said light being produced by the junction 22, varies. Therefore, the current flowing in the load 28, which is connected in series with a source of current supply 30 between spaced electrodes 24 and 26 in the layer 17, varies in accordance with the current flowing between the electrodes 18 and 20. Since, as will be more fully disclosed, the block 10 is small and monolithic, a small one piece coupler of the light emitter to light sensor type has been disclosed. If, in the use of the described coupler, it is necessary to electrically isolate the light emitter comprising the layers 12 and 14 from the light sensor comprising the layer 17, the coupler of FIG. 1 is used which includes the semi-insulating layer 16 is applied to the N type layer 14 before the layer 17 is applied thereto. The light coupler of FIG. 2 may be used where such electrical isolation is not necessary.

Two configurations of the described light couplers of FIGS. 1 and 2 are desirable. For the first configuration, the materials of all the layers must be one single crystal, the layers being provided by homoepitaxy, heteroepitaxy, diffusion or a combination of these processes. For the second configuration, the coupler may be other than monocrystalline as is further explained hereinafter. For the first configuration, many possible materials exist for the several layers, such as GaAs for each of the layers 12 and 14, GaAs for the layer 16 and Ge for the layer 17. Similarly the layers 12 and 14 may each be GaAs while the layers 16 and 17 may each be PbS. Or the layers 12 and 14 may each be GaAs while the layers 16 and 17 may be GaAs and PbS respectively, or the layers 16 and 17 may each be GaP and the layers 16 and 17 may be GaP and Si respectively.

Figure 3:
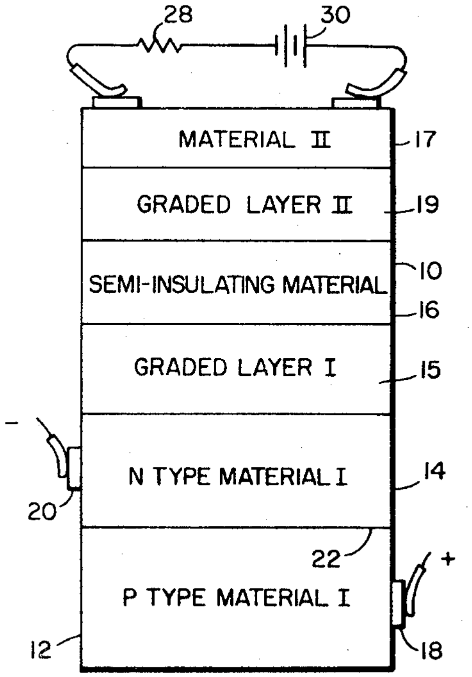

At this point FIG. 3 is called to attention. FIG. 3 resembles FIG. 1 whereby the same reference characters are used for the same elements in these two Figures. FIG. 3 differs from FIG. 1 in that a graded layer 15 is positioned between the layer 14 and the layer 16, while another graded layer 19 is positioned between the layer 16 and the layer 17. The graded layer 15 is graded in chemical composition so that the bottom portion of the layer 15 has nearly the same lattice parameter as the layer 14 which it contacts while the lattice parameter at the top of the layer 15 is nearly the same as the lattice parameter of the layer 16 which it contacts, the lattice parameter changing from one value to the other in the layer 15 in a gradual manner. The lattice parameter may be defined as the dimension of a unit cell in a crystal structure and is related to the distance between atoms in a crystal structure. By use of a graded layer such as layer 15, the materials of the layer 14 and of the layer 16 may have quite different lattice parameters and it may be possible to make those layers 12, 14, 15 and 16 in single crystalline form. Similarly the graded layer 19 may be provided between the layers 16 and 17, whereby the layers 16, 19 and 17 may be of single crystalline form even though the lattice parameters of the layers 16 and 17 are so different that without the graded layer, single crystalline form of the several layers may be impossible. It will be understood that one or both of the graded layers 15 and 19 may be omitted if the layers that they separate have lattice parameters so close that the single crystal form of the two layers is possible without a graded layer. Or, expressed differently, heteroepitaxy of materials which would not normally be possible can be achieved by use of such graded layers. As an example (without using a graded layer 15) the layers 12, 14 and 16 may each be GaAs, the layer 19 may comprise a bottom thin sheet of GaAs, an intermediate thin sheet of $GaAs_{1-x}P_x$ and a top thin sheet of GaP, whereby, upon using a layer 17 of Si, the layers 12, 14, 16, 19 and 17 may be a single crystal. The graded layers 15 and 19 when used must be at least partially transparent to the light emitted from the PN junction 22 and the combined layers 15 and 16, or 15, 16 and 19, or 16 and 19 must also fulfill this requirement. That is, the light produced at the PN junction 22 must arrive at the light sensor 17.

For the second configuration, one or more layers and particularly the sensor layer 17 may be polycrystalline. The use of polycrystalline materials permits a much wider variety of combination of materials for the layers 12, 14, 16 and 17 since homoepitaxy or heteroepitaxy which produces single crystals is not required in the production of all the polycrystalline layer or layers. Therefore, by use of a polycrystalline layers or layers, materials for the layer 17 may be chosen to closely match the sensitivity of the sensor layer 17 with the wave length of the light emitted from the vicinity of the PN junction 22, the graded layers 15 and 19 of course being omitted. For example, using the second configuration, layers 12 and 14 may each be GaAs and the layers 16 and 17 may be GaAs and Si respectively, the Si layer 17 being polycrystalline. If desired, the layer 12 could be N type and the layer 14 could be P type material.

Figure 4:
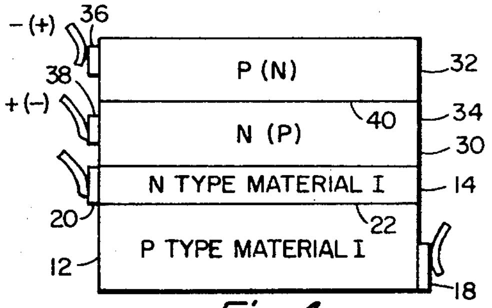

Turning to FIG. 4, the coupler 30 of FIG. 4 comprises a light emitter comprising the layer 12 of P type semiconductive material having an electrode 18 fixed thereto and the layer 14 of N type semiconductive material having an electrode 20 fixed thereto, while the light sensor comprises a PN junction 40 including P material 32 and N material 34, the light sensor being fixed to the N type material layer 14, and the PN junction 22 of the light emitter and the PN junction 40 of the light sensor being so positioned that a large portion of the light produced by the light producing junction 22 arrives at the light sensing junction 40. A reverse voltage may be applied across the electrodes 36 and 38 which are fixed respectively to the layers 32 and 34. Upon light from the PN junction 22 arriving at the PN junction 40, the conductivity across the junction 40 in the reverse direction is varied by this light. As indicated by the letters N and P which are shown in parenthesis in FIG. 4, the P layer and the N layer may be reversed in position and if reverse bias is applied across the PN junction between these P and N layers, the device of FIG. 4 as modified will also act as a light coupler.

Figure 5:
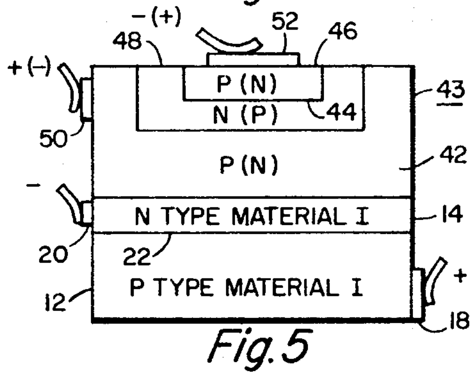

In FIG. 5, the coupler 43 comprises a light sensor which includes a PNP transistor, the collector comprising the P layer 42 being in contact with the N layer 14 of the light emitter which also comprises part of the light coupler 43. The emitter 46 and the collector 42 are biased in the normal manner with respect to the base 48. The light from the PN junction 22 of FIG. 5 arrives in the base region 48 of the transistor creating hole-electron pairs which act as base current for the transistor and drive it. The current in the collector 42 as seen at the electrode 50, which is ohmically connected to the collector 42, then varies in accordance with the light arriving in the base region 48, whereby the transistor comprising the collector 42, the base 48 and the emitter 46 acts as a light sensor. If desired, a base contact (not shown) may be added to the base layer 48 and bias current may be supplied thereto, so that the light from the junction 22 acts to modulate the collector current of the transistor. In this embodiment, as noted by the letters shown in parenthesis in FIG. 5, the transistor there shown may be an NPN one rather than the PNP mentioned, and the so modified structure will operate as a coupler in a similar manner.

Figure 6:
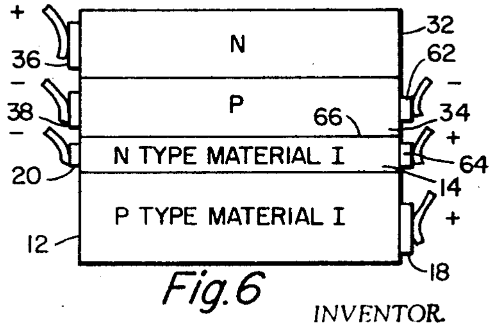

In FIG. 6, the coupler 60 resembles the coupler of FIG. 4 except that additional electrodes 62 and 64 are applied to the layers 34 and 14 respectively and a voltage is applied to the electrodes 62 and 64 that reverse biases the PN junction 66 between the diode light emitter comprising the layers 12 and 14 and the diode light sensor comprising the layers 32 and 34. This reverse bias applied to the junction 66 acts to electrically isolate the input voltages applied to the light emitting portion comprising the layers 12 and 14 from the output voltage obtained from the light sensor portion comprising the layers 32 and 34 of the coupler 64. Similar reverse bias may be applied to the PN junction between the layers 14 and 42 of FIG. 5 for similar purposes.

Figure 7:
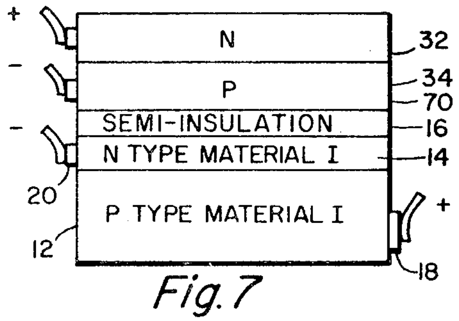

FIG. 7 resembles FIG. 6 except that FIG. 7 includes a semi-insulative layer 16 and omits electrodes 62 and 64, whereby no further description of FIG. 7 need be given.

As will be noted, in each of FIGS. 1 through 7, the same form of light emitter is shown. It is clear that any solid state emitter may be substituted for the light emitter shown and can be used with any light sensor in the several Figures, or with other known solid state light sensors such as thyristors, varactors, Darlington pairs and many others.

As noted above, the light coupler is of monolithic and crystalline construction. In the construction of this device, the diode comprising the layers 12 and 14 is produced in any known manner. Then, the semi-insulative layer 16, if used as in FIG. 1, is grown epitaxially on the layer 14 and then the light sensor layer 17 is grown thereon heteroepitaxially as by vapor deposition on the layer 16. If the layer 16 is not used, the layer 17 may be grown or deposited directly on the layer 14 as in FIG. 2. Or, any sequence of growing and providing the layers may be used as long as a crystalline structure results. This method of construction applies to the several Figures, as distinct from providing a solid state light emitter and a solid state light sensor and glueing or cementing or fixing these discrete devices together.

It will be recognized that in the structures as shown and described, the electrical isolation is only partial between the light emitter and the light sensor portion of the couplers and that in certain configurations thereof, current paths will exist through the entire device when the light emitter portion is operative. This lack of complete current isolation may be advantageous in many applications of the coupler to reduce current flow in electrical circuits containing the coupler, or to provide latching current paths through the coupler and through parts of the circuit even though the current path to the layer 14 by way of the electrode 20 be interrupted. However, if it is desired to increase the electrical isolation between the light emitter and the light sensor portions of the coupler, a semi-insulative layer 16, such as is shown in FIGS. 1 and 7 may be included between the light sensor and the light emitter portion of the coupler.

The advantages of the described couplers include the following: Having a monocrystalline structure results in higher efficiency of coupling since the light need not go through an interface material having a significantly lower index of refraction thereby reducing light transfer in going from the light emitter to the light sensor when the light emitter and light sensor is bonded together. The monocrystalline form results in higher structural reliability at the coupler. The monocrystalline coupler is easier to fabricate than where it is necessary to make several units and fix them together. When a polycrystalline sensor or a polycrystalline semi-insulating layer or both are used with a monocrystalline light emitter, the resultant structure is easier and cheaper to make than a monocrystalline coupler and the use of the polycrystalline sensor or semi-insulating layer or both makes it possible to position the light emitter and the light sensor closer to each other, even if the semi-insulating layer is used than if the sensor be monocrystalline and be distinct from except that it is glued to the emitter. If glass is used as the isolating layer, due to its lower index of refraction, less light arrives at the sensor from the emitter than with the materials listed above for the layer 16.

What is claimed is:

1. A monolithic coupling device comprising:

a first body of semiconductor material of a first conductivity type;

a second body of semiconductor material on said first body of semiconductor material, said first and second bodies of semiconductor material forming a light emitting PN junction;

first and second contact means connected, respectively, to said first and second bodies of semiconductor material for providing electrical connection thereto;

insulating means formed on said first body of semiconductor material, said insulating means being at least partially transparent to light emitted by said light emitting PN junction;

light sensor means on said insulating means, wherein said insulating means includes a second layer on said first body of semiconductor material, a third layer of high resistivity material on said second layer, and a fourth layer on said third layer, said second layer being graded in chemical composition so that its lattice parameter varies in value from approximately the value of the lattice parameter of said first body of semiconductor to approximately the value of the lattice parameter of said third layer, and said fourth layer graded in chemical composition so that its lattice parameter varies in value from approximately the value of the lattice parameter of said third layer to approximately the value of the lattice parameter of said light sensor means.

2. The monolithic coupling device as recited in claim 1 wherein said light sensor means include a photoconductive layer on said insulating.

3. The monolithic coupling device as recited in claim 1 wherein said light sensor means include a light sensing diode.

4. The monolithic coupling device as recited in claim 1 wherein said light sensor means include a light sensing transistor.

5. A monolithic solid state coupling device comprising:

a first body of semiconductor material of a first conductivity type;

a second body of semiconductor material on said first body of semiconductor material, said first and second bodies of semiconductor material forming a light emitting PN junction;

first and second contact means connected, respectively, to said first and second bodies of semiconductor material for making electrical connection thereto;

an insulating layer at least partially transparent to light emitted by said light emitting junction formed on said first body of semiconductor material;

a first layer of photoconductive material on said insulating layer, said first layer of photoconductive material having thereon spaced third and fourth contact means, wherein said insulating layer is formed of material selected from the group consisting of GaAs and $GaAs_{1-x}P_x$, and said first layer of photoconductive material is formed of material selected from the group consisting of Si, Ge, PbS, and said first and second bodies of semiconductor material are formed of material selected from the group consisting of GaAs, $GaAs_xP_{1-x}$, and $Ga_{1-x}In_xP$.

6. The monolithic solid state coupling device as recited in claim 5 wherein said first conductivity type is n-type and said second conductivity type is p-type.

* * * * *